(12) United States Patent
Devgan et al.

(10) Patent No.: US 6,308,304 B1
(45) Date of Patent: Oct. 23, 2001

(54) METHOD AND APPARATUS FOR REALIZABLE INTERCONNECT REDUCTION FOR ON-CHIP RC CIRCUITS

(75) Inventors: Anirudh Devgan; Peter Redmond O'Brien, both of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/321,785

(22) Filed: May 27, 1999

(51) Int. Cl.[7] ....................................... G06F 17/50
(52) U.S. Cl. ..................................................... 716/5
(58) Field of Search ........................ 716/1, 5, 11

(56) References Cited

U.S. PATENT DOCUMENTS 5,610,832 * 3/1997 Wikle et al. ......................... 716/11
5,999,726 * 12/1999 Ho ........................................ 716/11

* cited by examiner

*Primary Examiner*—Trong Phan
(74) *Attorney, Agent, or Firm*—Duke W. Yee; Casimer K. Salys

(57) ABSTRACT

Realizable interconnect reduction techniques for on-chip RC interconnects are disclosed by first partitioning the original circuit into sets of two-port circuits to maintain the spatial sparsity of the reduced model. Each original two-port circuit is matched to a reduced RC circuit having a specific configuration. The moments of the original two-port circuits are calculated. Closed form expression values of the reduced circuit elements are then calculated from the moments of the original circuits. The closed form expressions for calculating the values of the elements in the reduced circuit use a reduced number of independent variables associated with the elements, thus simplifying the calculations. An efficient linear time moment computation technique is used for computing the moments for the two-port circuits.

22 Claims, 7 Drawing Sheets

METHOD AND APPARATUS FOR REALIZABLE INTERCONNECT REDUCTION FOR ON-CHIP RC CIRCUITS

CROSS REFERENCE TO RELATED APPLICATION

The present application is related to copending U.S. Pat. application Ser. No. 09/321,791 filed even date herewith. The above mentioned patent applications are assigned to the assignee of the present invention. The content of the cross referenced copending application is hereby incorporated herein by reference.

BACKGROUND OF THE INVENTION

1. Technical Field

The present invention relates to circuit design and verification of circuits. More particularly, the present invention relates to interconnection circuit modeling. Still more particularly, the present invention relates to model reduction for interconnection circuit modeling and analysis.

2. Description of Related Art

Interconnect effects are critically important in the design and verification of integrated circuits. On-chip interconnects are typically modeled by linear resistive (R) and capacitive (C) elements. In some cases, very few global nets may also include inductive (L) elements. With the scaling of the Back-End-Of-the-Line (BEOL) interconnect processes, the effect of interconnect on circuit performance continues to increase. In case of global nets (i.e., nets connecting one macro to another macro), the interconnect delay can typically be much greater than the logic delay. Even among nets within a macro, the interconnect delay can constitute a significant portion of the path delay (i.e., typically up to 25%).

Interconnect modeling is typically performed through a layout-based extraction procedure. Extracted data from a microprocessor may require 2–4 gigabytes of storage. Given the massive amount of data generated by parasitic extractors, it is typically not feasible to perform circuit analysis without use of model reduction or other interconnect pruning techniques.

Model reduction takes an original linear circuit and reduces it to a much smaller linear representation while maintaining much of the circuit performance. Model reduction has been an area of considerable research over the last several years, with much of the work originating from Asymptotic Waveform Evaluation (AWE), disclosed by Pillage and Rohrer in "Asymptotic Waveform Evaluation for Timing Analysis", *IEEE Trans. Computer Aided Design*, 9(4):352–366, Apr. 1990. AWE computes the moments of the original circuit and then matches these moments to a reduced-order transfer function using Pade approximation. Along with the moment matching techniques, AWE, and later RICE, disclosed by Ratzlaff and Pillage in "RICE: Rapid Interconnect Circuit Evaluator using Asymptotic Waveform Evaluation", *IEEE Transactions on Computer Aided Design*, pp. 763–776, June 1994, proposed an efficient way of computing the circuit moments by repeated DC solutions. Typically, RC circuits can be modeled by a handful of moments. RLC and PEEC circuits require much larger numbers of moments, though they are typically not used to model on-chip interconnects. The repeated DC solutions used to compute moments causes the accuracy of the moments to decrease as the number of moments increase. Several techniques, notably using Krylov-subspace methods, were developed to increase the accuracy of the model reduction procedure, as disclosed by Feldmann and Fruend, "Reduced-order modeling of large linear subcircuits via a block Lanczos algorithm", *Proceedings of ACM/IEEE Design Automation Conference*, pp. 474–479, 1995; Kerns, Wemple and Wang, "Stable and Efficient Reduction of Substrate model networks using Congruence Transforms", *Proceedings of IEEE International Conference on Computer Aided Design*, pp. 207–214, November 1995; Gallivan, Grimme and Van Dooren, "Asymptotic Waveform Evaluation via a Lanczos Method", Applied Mathematics Letters, 7(5):75–80, 1994; Silveria, Kamon, Elfadel and White, "Coupled circuit-interconnect analysis using Arnoldi-based model order reduction", *IEEE Transactions on Computer Aided Design*, 1995. Krylov-subspace methods can match a much higher number of implicit moments yielding much higher accuracy. These techniques are also more suitable for analyzing the frequency response of linearized analog circuits. Block Krylov-subspace methods were developed to handle multi-port circuits; however, these methods typically work well only when the number of ports is less than ten. Krylov-subspace techniques match the original circuit to a set of state equations that describe the reduced circuit. However, the reduced order state equations may not be passive or realizable. Techniques disclosed in Odabasioglu, Celik and Pileggi, "PRIMA: Passive Reduced-Order Interconnect Macromodeling Algorithm,"*IEEE Transactions on CAD*, pp. 645–654, August 1998; and Kerns et al., "Stable and Efficient Reduction of Substrate model networks using Congruence Transforms", extend the Krylov-subspace methods to guarantee the passivity of the reduced order state equations. However, these methods do not guarantee the realizability (i.e., modeling reduced order state equations by linear, passive circuit elements) of the reduced circuit equations. Realizability of the reduced order models has been shown only for single port circuits, as discussed in O'Brien and Savarino, "Modeling the driving-point characteristics of resistive interconnect for accurate delay estimation", *Proceedings of IEEE International Conference on Computer Aided Design*, pp. 512–515, November 1989; and Freund and Feldmann, "Reduced-Order Modeling of Large Passive Linear Circuits by Means of the SyPVL Algorithm, "*Proceedings of IEEE Conference on Computed Aided Design*, November 1996.

Realizable model reduction is particularly useful in interconnect analysis. In a typical design methodology, various circuit analysis and verification procedures (e.g., static timing, dynamic simulation, noise analysis, circuit checking, power analysis, etc.) are performed on the extracted parasitic data. If the model reduction of the parasitic data is not realizable, it produces reduced transfer functions or reduced state equations and not reduced RC circuits. Hence, all downstream circuit simulators and associated programs have to be modified to handle reduced order equations. Realizable reduced models are even more useful when both linear and nonlinear parts of the circuit have to be analyzed together. Furthermore, several circuit analysis programs (like circuit checking) only work if the input is in the form of an RC circuit.

Apart from realizability, another significant problem in interconnect analysis is the large number of ports. For example, RC circuits originating from clock and power distribution networks may have hundreds of ports. In some cases, especially for linear analysis, the prior art approximates these networks with single port networks having linear terminations at the other ports. This approximation to single port networks has the disadvantages of causing a loss in accuracy and difficulty in predicting when the approximation works well. For on-chip interconnects, addressing the need for an increase in the number of ports is often more important than increasing the order of the approximation. On-chip interconnects do not require large numbers of moments to produce accurate results. However, they typically do have large numbers of ports. Model reduction of these circuits yields a dense reduced order model which can be prohibitively expensive to analyze using downstream circuit analysis tools. The matrix factorization of a dense matrix is order $O(n^3)$, whereas the matrix factorization of a sparse matrix is order $O(n^{1.5})$. For the case of circuits with large numbers of ports, the simulation with reduction may often take longer than simulation without reduction.

SUMMARY OF THE INVENTION

The present invention discloses a realizable model reduction and linear circuit partitioning techniques. A multi-port circuit is first partitioned into sets of two-port circuits. This partitioning maintains the spatial sparsity of the original circuit. Each two-port circuit is then reduced to an equivalent and realizable RC circuit. Instead of assuming a transfer function or state equations as the model for the reduced system, a representative RC circuit is assumed as the model for the reduced system. The model reduction procedure consists of computing R and C element values for the assumed reduced order circuit. Closed form expressions are derived to compute the element values. Interconnect reductions of each two-port circuit are reconnected to yield the final reduced circuit. This procedure works exceeding well for most on-chip interconnects. The procedure of the present invention does not handle coupling capacitors.

In a preferred embodiment of the present invention, moments of the transfer function are computed for each two-port network. The moments can be computed by setting appropriate excitation and by performing matrix factorization. However, matrix factorization is superlinear with a number of nodes in the circuit. Path tracing can be modified to handle two-port circuits; however, it still requires an inverse of a smaller matrix. Specifically, a preferred embodiment of the present invention discloses a linear time moment computation method for two-port circuits. This method does not require matrix factorization and instead uses repeated Norton to Thevenin conversions to compute the circuit moments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
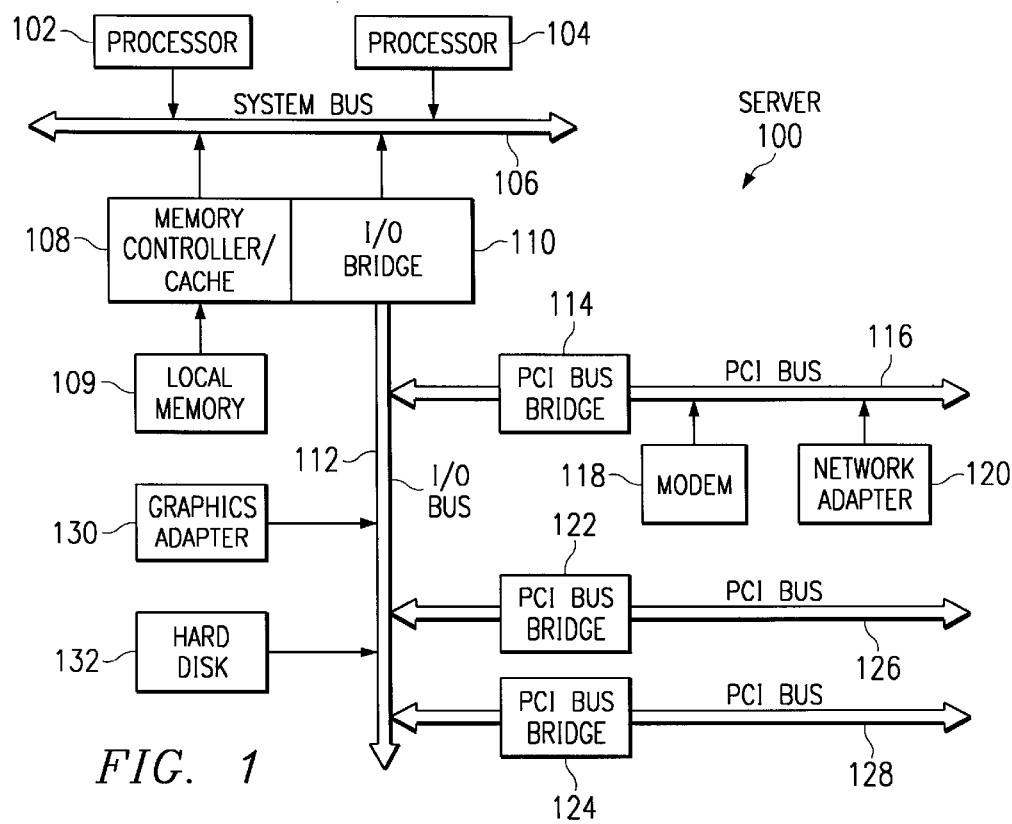
FIG. 1 is a block diagram of a data processing system depicted in accordance with the present invention.

With reference now to the figures, and in particular with reference to FIG. 1, a block diagram of a data processing system is depicted in accordance with the present invention. Data processing system 100 may be a symmetric multiprocessor (SMP) system including a plurality of processors 102 and 104 connected to system bus 106. Alternatively, a single processor system may be employed. Also connected to system bus 106 is memory controller/cache 108, which provides an interface to local memory 109. I/O bus bridge 110 is connected to system bus 106 and provides an interface to I/O bus 112. Memory controller/cache 108 and I/O bus bridge 110 may be integrated as depicted.

Peripheral component interconnect (PCI) bus bridge 114 connected to I/O bus 112 provides an interface to PCI local bus 116. Modem 118 and network adapter 120 may be connected to PCI bus 116. Typical PCI bus implementations support four PCI expansion slots or add-in connectors.

Additional PCI bus bridges 122 and 124 provide interfaces for additional PCI buses 126 and 128, from which additional modems or network adapters may be supported. In this manner, server 100 allows connections to multiple network computers. A memory mapped graphics adapter 130 and hard disk 132 may also be connected to I/O bus 112 as depicted, either directly or indirectly.

Those of ordinary skill in the art will appreciate that the hardware depicted in FIG. 1 may vary. For example, other peripheral devices, such as optical disk drives and the like, also may be used, in addition to or in place of the hardware depicted. The depicted example is not meant to imply architectural limitations with respect to the present invention.

The data processing system depicted in FIG. 1 may be, for example, an IBM RISC/System 6000 system, a product of International Business Machines Corporation in Armonk, N.Y., running the Advanced Interactive Executive (AIX) operating system.

Figure 2:
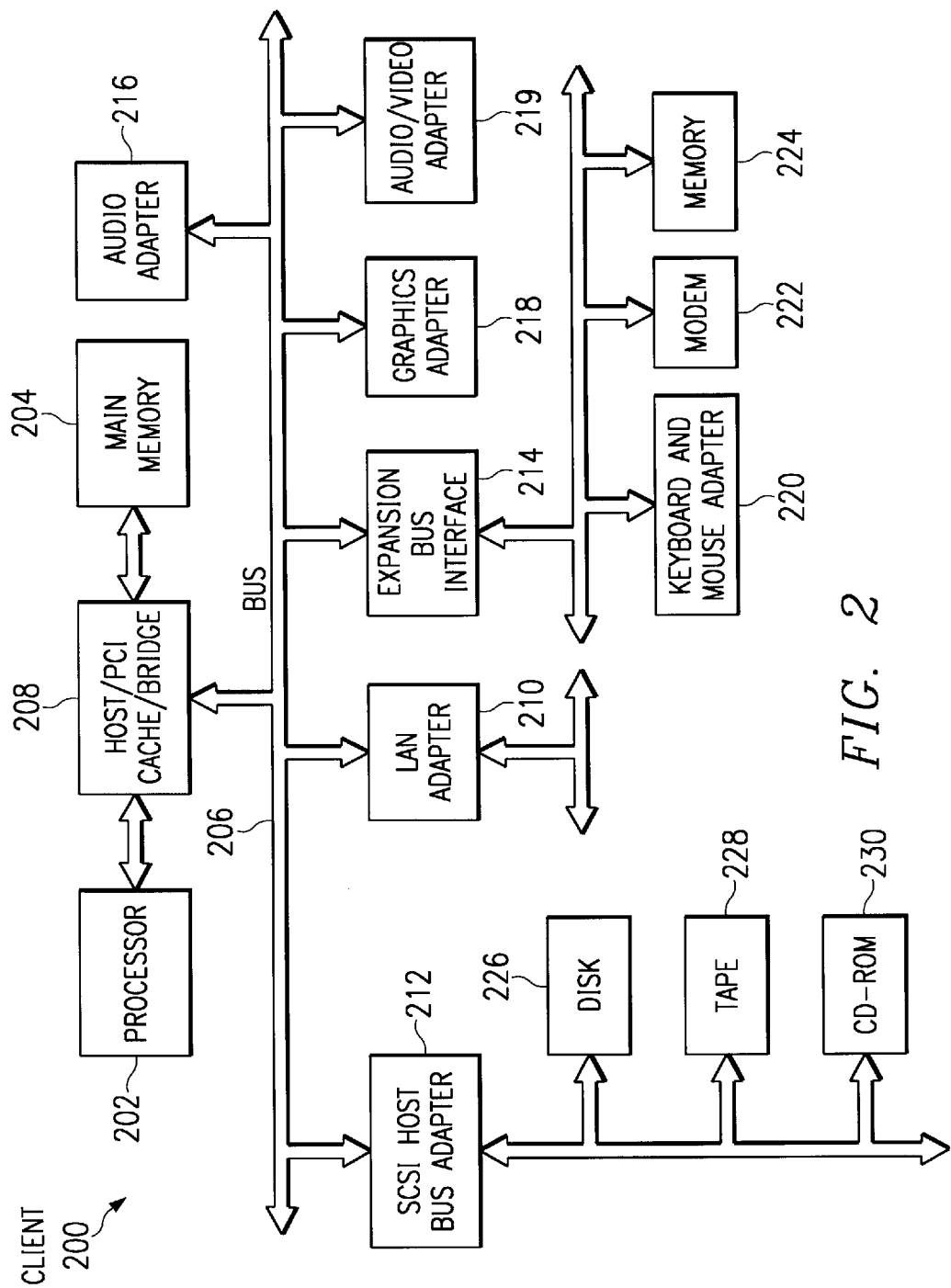
FIG. 2 is a block diagram illustrating a data processing system in which the present invention may be implemented.

With reference now to FIG. 2, a block diagram of a data processing system in which the present invention may be implemented is illustrated. Data processing system 200 is an example of a client computer. Data processing system 200 employs a peripheral component interconnect (PCI) local bus architecture. Although the depicted example employs a PCI bus, other bus architectures such as Micro Channel and ISA may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards. In the depicted example, local area network (LAN) adapter 210, SCSI host bus adapter 212, and expansion bus interface 214 are connected to PCI local bus 206 by direct component connection. In contrast, audio adapter 216, graphics adapter 218, and audio/video adapter (A/V) 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230 in the depicted example. Typical PCI local bus implementations support three or four PCI expansion slots or add-in connectors.

In the present example, an operating system runs on processor 202 and is used to coordinate and provide control of various components within data processing system 200 in FIG. 2. The operating system may be a commercially available operating system, such as OS/2, which is available from International Business Machines Corporation. "OS/2" is a trademark of International Business Machines Corporation. An object oriented programming system such as Java may run in conjunction with the operating system and provides calls to the operating system from Java™ programs or applications executing on data processing system 200. Instructions for the operating system, the object-oriented operating system, and applications or programs are located on storage devices, such as hard disk drive 226, and may be loaded into main memory 204 for execution by processor 202. Application programs may include processes such as those discussed below with respect to the processes depicted in FIGS. 6, 9 and 14 below.

Those of ordinary skill in the art will appreciate that the hardware in FIG. 2 may vary depending on the implementation. For example, other peripheral devices, such as optical disk drives and the like, may be used in addition to or in place of the hardware depicted in FIG. 1. The depicted example is not meant to imply architectural limitations with respect to the present invention. For example, the processes of the present invention may be applied to multiprocessor data processing systems.

Figure 3:
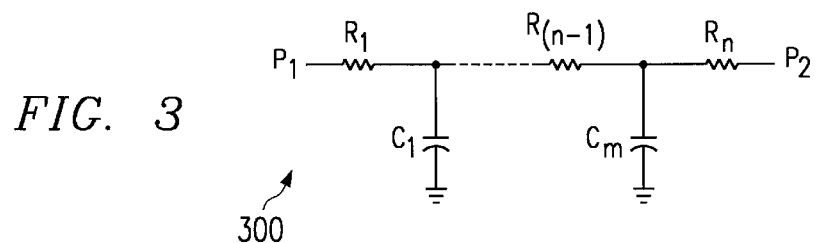
FIG. 3 depicts a typical two-port RC circuit.

FIG. 3 is a block diagram depicting a typical two-port RC circuit. RC circuit 300 depicts a plurality of resistors, $R_1$–$R_n$ and a plurality of sinks $C_1$–$C_m$ disposed between port $P_1$ and port $P_2$. The behavior of the circuit shown in FIG. 3 can be completely described by its transfer function matrix, Y(s). Let I(s) be the vector of port currents and V(s) the vector of port voltages. The transfer function can be written in matrix form:

$$\begin{bmatrix} I_1(s) \\ I_2(s) \end{bmatrix} = \begin{bmatrix} Y_{11}(s) Y_{12}(s) \\ Y_{21}(s) Y_{22}(s) \end{bmatrix} \begin{bmatrix} V_1(s) \\ V_2(s) \end{bmatrix} \quad \text{Equation (1)}$$

Where $I_1$ is the current into port $P_1$, $V_1$ is the voltage across port $P_1$, $I_2$ is the current into port $P_2$ and $V_2$ is the voltage across port $P_2$. Note that $Y_{12}(s)=Y_{21}(s)$ for linear RC circuits.

Figure 4:
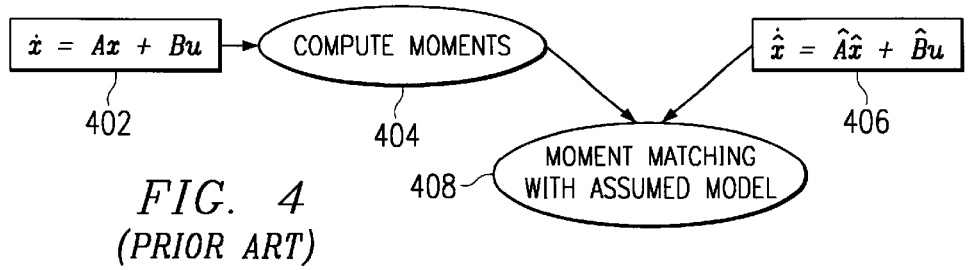
FIG. 4 is a block diagram depicting a prior art reduction technique.

FIG. 4 is a diagram depicting a prior art reduction technique. The technique may be implemented as one of the methods discussed above, such as the RICE, AWE or Krylov-Subspace methods. The process begins with an original circuit to be reduced (step 402). Traditional reduction procedures model the exact transfer function Y(s) with an approximate transfer function, Ŷ(s). The computation of moments (explicit or implicit) of the original circuit is the first step in the reduction procedure (step 404). An assumed reduced-order model is then constructed as a set of state equations (step 406). These moments are then matched to an assumed model to get the reduced circuit equations (step 408). Hence, it is difficult to convert these reduced circuit equations to a realizable circuit. One disadvantage of the prior art is that the resultant model cannot be converted to an equivalent RC circuit for multi-port circuits. Another problem is that the resultant model requires changes in the downstream analysis programs. For realizable reduction, it would be better to assume another, smaller RC circuit as the reduced model.

Figure 5:
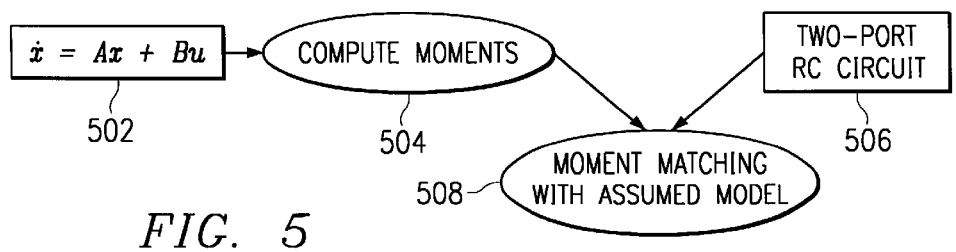
FIG. 5 is a block diagram depicting a reduction technique in accordance with a preferred embodiment of the present invention.

FIG. 5 is a diagram depicting a reduction technique in accordance with a preferred embodiment of the present invention. The process begins with an original circuit to be reduced (step 502). The computation of moments, either explicit or implicit, of the original circuit is performed as in the prior art (step 504). An assumed reduced-order model is then constructed which consists of computing the numerical values of the elements in the assumed RC circuit (step 506). These moments are then matched to an assumed model comprised of the simplified RC circuit (step 508).

The choice of the reduced RC circuit is an important part of the realizable reduction procedure. The reduced RC circuit should share the same properties as the original RC circuit. For the case of on-chip interconnects, the following three assumptions can be made for the original RC circuit:

(1) The original multi-port circuit has been partitioned into sets of connected two-port RC circuits.

(2) Each two-port RC circuit has no DC path to ground.

(3) Each two-port RC circuit has a DC path from the one port to the other port.

Most on-chip interconnects exhibit the above mentioned properties and partition nicely into sets of two-port circuits. Given these sets of assumptions for the original circuit, a reduced RC circuit is obtainable.

Figure 6:
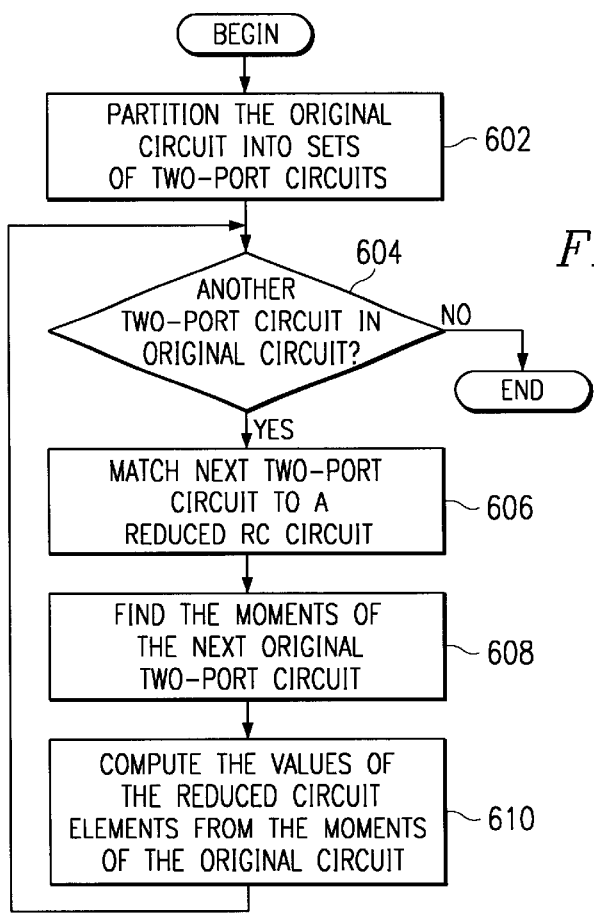
FIG. 6 is a block diagram illustrating the realizable interconnect circuit reduction process in accordance with a preferred embodiment of the present invention.

FIG. 6 is a flowchart depicting the realizable interconnect circuit reduction process in accordance with a preferred embodiment of the present invention. The process commences by partitioning the original circuit into sets of two-port circuits (step 602). After the original circuit is partitioned, each two-port circuit is handled separately. A determination is made if there is a next original circuit to be reduced (step 604). Step 604 starts a loop which provides a logical means for reducing partitioned original two-port circuits. Assuming such a circuit exists, the process flows to step 606, where the original circuit is matched to a reduced circuit. In accordance with a preferred embodiment of the present invention, the reduced circuit is configured in a specific elemental topology as will be discussed below. Next, the moments of the original two-port circuit are computed (step 608). In further accordance with a preferred embodiment of the present invention, using a specific circuit topology a process for efficiently determining the moments of the original two-port circuit are likewise discussed below. After finding the moments of the original circuit, the values of each element in the reduced circuit can be calculated (step 610). The accurate and efficient calculation of the reduced two-port circuit's element values is a critical step in the process and may be calculated in accordance with a preferred embodiment of the present invention, which will be discussed in detail below. Finally, the process returns to step 604, where a check is again made for the next original circuit to be reduced. If one exists, the original circuit is reduced using the method described above. Otherwise, the process ends.

Figure 7:
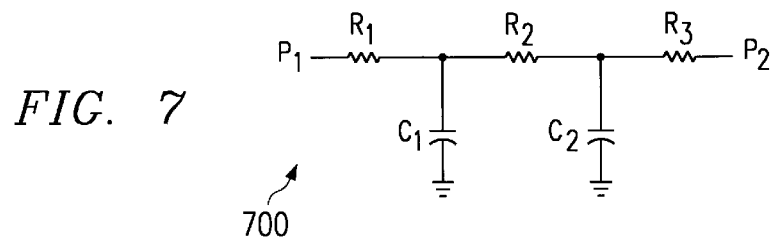
FIG. 7 is a circuit diagram of a reduced RC circuit model in accordance with a preferred embodiment of the present invention.

FIG. 7 is a circuit diagram of a reduced RC circuit model in accordance with a preferred embodiment of the present invention. RC circuit 700 is a reduced two-port circuit model configured in a specific elemental topology. RC circuit 700 is a two-port model having port $P_1$ and port $P_2$, with resistor $R_1$ connected to port $P_1$ and resistor $R_2$, and resistor $R_3$ connected to port $P_2$ and the end of resistor $R_2$ opposite resistor $R_1$. One end of each of capacitors $C_1$ and $C_2$ is interposed between the junctions of resistors $R_1$ and $R_2$, and $R_2$ and $R_3$, respectively. The opposite ends of capacitors $C_1$ and $C_2$ terminate to grounds.

Realizable reduction can be performed if it is possible to:
(1) Compute the values of circuit elements ($R_1$, $R_2$, $R_3$, $C_1$, $C_2$) from the moments of the original circuit.
(2) Demonstrate that all circuit elements have positive values, i.e., $R_1>0$, $R_2>0$, $R_3>0$, $C_1>0$ and $C_2>0$.

The transfer function of the original circuit can be written as:

$$Y(s)=Y_0+Y_1s+ \qquad \text{Equation (2)}$$

or, $$Y(s) = \begin{bmatrix} (y_{11})_0 & (y_{12})_0 \\ (y_{21})_0 & (y_{22})_0 \end{bmatrix} + \begin{bmatrix} (y_{11})_1 & (y_{12})_1 \\ (y_{21})_1 & (y_{22})_1 \end{bmatrix} s + \ldots \qquad \text{Equation (3)}$$

The first two expansion terms of transfer function Y(s) (see Equation (3)) are used to compute the element values of the reduced circuit. The first two expansion terms contain eight moments. However, the following four relationships hold between these moments:

$$(y_{11})_0=(y_{22})_0=-(y_{12})_0=-(y_{21})_0>0 \qquad (1)$$

$$(y_{12})_1=(y_{21})_1 \qquad (2)$$

$$(y_{11})_1>0, (y_{12})_1>0, (y_{22})_1>0 \qquad (3)$$

$$(y_{11})_1(y_{22})_1-(y_{12})_1^2>0 \qquad (4)$$

Given the relationship between the first eight moments, there are only four independent moments in Equation (3). The assumed reduced order circuit in FIG. 7 has five elements (three resistors, $R_1$, $R_2$ and $R_3$, and two capacitors, $C_1$ and $C_2$).

Figure 8:
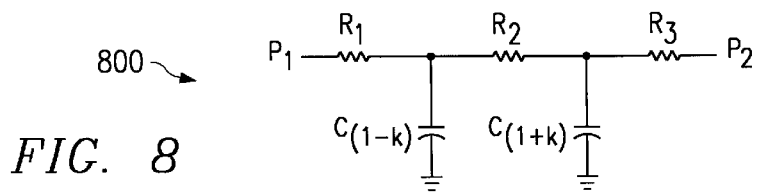
FIG. 8 is a circuit diagram of a reduced RC circuit model in accordance with a preferred embodiment of the present invention.

FIG. 8 is a circuit diagram of a reduced RC circuit model in accordance with a preferred embodiment of the present invention. To aid the derivation of the reduced circuit, the circuit elements of circuit 800 are rewritten in terms of four independent variables, $R_1$, $R_2$, $R_3$ and C. A single dimensionless variable k is introduced that relates the values of the two capacitors. Alternatively, the capacitor values are written as:

$$C_1=(1-k)C \qquad \text{Equation (4)}$$

$$C_2=(1+k)C \qquad \text{Equation (5)}$$

For the reduced circuit to be passively realizable, the following three conditions must be true:

$$R_1>0, R_2>0, R_3>0 \qquad (1)$$

$$C>0 \qquad (2)$$

$$-1<k<1 \qquad (3)$$

The parameter k can be viewed as a "realizability parameter," as only a range of values for the parameter will yield a realizable circuit. The parameter k is not independent. It is considered to be a fixed value during moment matching, so that the number of truly independent circuit variables and the number of unique moments are both equal to four. As discussed in detail below, a value for k can be chosen ahead of time to guarantee realizability and stability of the reduced circuit.

Four independent moments of the original circuit from Equation (3) are symbolically matched to the corresponding moment of the reduced circuit in FIG. 8, yielding to the following set of equations:

$$R_1 + R_2 + R_3 = \frac{1}{(y_{11})_0} \qquad \text{Equation (6)}$$

$$(1-k)CR_3^2 + (1+k)CR_3^2 + \qquad \text{Equation (7)}$$
$$2(1-k)CR_3R_2 + (1-k)CR_2^2 = \frac{(y_{11})_1}{(y_{11})_0^2}$$

$$(1-k)CR_1^2 + (1+k)CR_1^2 + \qquad \text{Equation (8)}$$
$$2(1+k)CR_1R_2 + (1+k)CR_2^2 = \frac{(y_{22})_1}{(y_{22})_0^2}$$

$$\text{Equation (9)}$$
$$(1-k)CR_1R_3 + (1+k)CR_1R_3 +$$
$$(1-k)CR_1R_2 + (1+k)CR_3R_2 = \frac{(y_{12})_1}{(y_{11})_0^2}$$

This set of equations can then be symbolically inverted to solve for $R_1$, $R_2$, $R_3$ and C in terms of $(y_{11})_0$, $(y_{11})_1$, $(y_{12})_1$, $(y_{22})_1$ and fixed parameter k. The following expressions are obtained for $R_1$, $R_2$, $R_3$ and C.

$$C = \frac{1}{2}[(y_{11})_1 + 2(y_{12})_1 + (y_{22})_1] \qquad \text{Equation (10)}$$

-continued $$R_2 = \frac{2\sqrt{D}}{(y_{11})_0\sqrt{(1-k^2)[(y_{11})_1+2(y_{12})_1+(y_{12})]^2}}$$

$$R_1 = \frac{(y_{12})_1+(y_{22})_1-\sqrt{D}\sqrt{\frac{1+k}{1-k}}}{(y_{11})_0[(y_{11})_1+2(y_{12})_1+(y_{22})_1]}$$

$$R_3 = \frac{(y_{12})_1+(y_{11})_1-\sqrt{D}\sqrt{\frac{1-k}{1+k}}}{(y_{11})_0[(y_{11})_1+2(y_{12})_1+(y_{22})_1]}$$

where $$D=(y_{11})_1(y_{22})_1-(y_{12})_1^2 \quad \text{Equation (11)}$$

Note that D is greater than zero for linear and passive original circuits. The next step is to demonstrate how to compute a value of k which guarantees realizability. By examining the numerators of expressions for $R_1$ and $R_3$, two boundary values for parameter k can be computed:

$$k_1 = \frac{((y_{12})_1+(y_{22})_1)^2-D}{((y_{12})_1+(y_{22})_1)^2+D} \quad \text{Equation (12)}$$

$$k_2 = \frac{-((y_{12})_1+(y_{11})_1)^2+D}{((y_{12})_1+(y_{11})_1)^2+D} \quad \text{Equation (13)}$$

When $k=k_1$, $R_1$ is zero. When $k=k_2$, $R_3$ is zero. Any choice of k in the range $k_2<k<k_1$ yields a realizable circuit model, and it is shown below that the relationship $-1<k_2<k_1<1$ always holds.

Condition for realizability: $-1<k_2<k_1<1$

Proof 1: $1-k_1 > 0$ $$1-k_1 = \frac{((y_{12})_1+(y_{22})_1)^2+D-((y_{12})_1+(y_{22})_1)^2+D}{((y_{12})_1+(y_{22})_1)^2+D}$$

$$= \frac{2D}{((y_{12})_1+(y_{22})_1)^2+D} > 0$$

Proof 2: $1+k_2 > 0$ $$1+k_2 = \frac{((y_{12})_1+(y_{11})_1)^2+D-((y_{12})_1+(y_{11})_1)^2+D}{((y_{12})_1+(y_{11})_1)^2+D}$$

$$= \frac{2D}{((y_{12})_1+(y_{11})_1)^2+D} > 0$$

Proof 3: $k_1-k_2 > 0$

Writing the expression for $k_1-k_2$ and performing some algebraic manipulations yields the following equivalent condition:

$$2(y_{12})_1^2+(y_{12})_1(y_{22})_1+(y_{12})_1(y_{11})_1>0$$

Hence, it can be seen that $k_1-k_2 > 0$.

It is shown that the realizability conditions are true for any two-port RC circuits. Any choice of k in the range $k_2<k<k_1$ will yield a realizable reduced circuit.

The following value for a realizability parameter is used in the reduction procedure:

$$k_r = \frac{k_1+k_2}{2} \quad \text{Equation (14)}$$

$$k_r = \frac{[(y_{22})_1-(y_{11})_1][(y_{11})_1+2(y_{12})_1+(y_{22})_1]}{[((y_{12})_1+(y_{22})_1)^2+D][((y_{12})_1+2(y_{11})_1)^2+D]} \quad \text{Equation (15)}$$

Computation of circuit moments is the first step in the reduction procedure. Given an original circuit, the four independent moments $(y_{11})_0$, $(y_{11})_1$, $(y_{12})_1$ and $(y_{22})_1$ need to be computed. Consider a linear circuit with the following state equations:

$$\dot{x}=Ax=Bv \quad \text{Equation (16)}$$

$$i=Cx+Dv$$

The transfer function $$(S) = \frac{I(s)}{V(s)}$$

is given by:

$$(s)=C(sI-A)^{-1}B+D=\{-CA^{-1}B+D\}-\{CA^{-2}B\}s+ \quad \text{Equation (17)}$$

The first two moments can be computed as follows:

First Moment: Set v=1, $\dot{x}$=0, solve for port current i

Second Moment: Set v=0, $\dot{x}$=$-A^{-1}B$, solve for port current i

A state variable can either be a capacitor or an inductor. In case of a capacitor, the voltage across the capacitor is the state variable and in case of an inductor its current through the inductor is the state variable. During moment computation, $\dot{x}$ is set to a particular value (either zero or $-A^{-1}B$) depending on which moment is being computed. For example, $\dot{x}$=m. In case of capacitor c, it translates to $\dot{v}$=m, and since $c\dot{v}$=I for a capacitor. This reduces to I/c=m, or I=cm. Hence, during moment computation capacitor c is replaced by a current source. In case of inductor 1, it translates to $\dot{i}$=m, and since $l\dot{i}$=V for inductor 1. This reduces to V/l=m, or V=lm. Hence, during moment computation an inductor is replaced by a voltage source.

For a two-port circuit v=$[v_1, v_2]^T$, the moments of each port are computed one at a time. While the moments of port ($v_1$) are being computed, the other port is set to zero(i.e., $v_2$=0) and vice versa. The circuit moments can be computed by formulating the circuit equation matrix (e.g., MNA) and performing one matrix factorization (LU) and repeated forward and backward substitution (FBS). While the complexity of FBS is linear in circuit size, the complexity of LU factorization is superlinear in circuit size. For tree-like single-port circuits, moments can also be computed by path tracing (as shown in RICE). Path tracing can be modified to compute moments of multi-port circuits; however, it still requires matrix factorization (although of a smaller matrix). A procedure for linear time circuit moment computation without using any matrix factorization is discussed immediately below. The combination of this moment computation procedure with the derived closed form equations results in an efficient model reduction technique.

In a preferred embodiment of the present invention, recursive Norton to Thevenin conversions can be used to compute moments of RC line-like two-port circuits.

Figure 9:
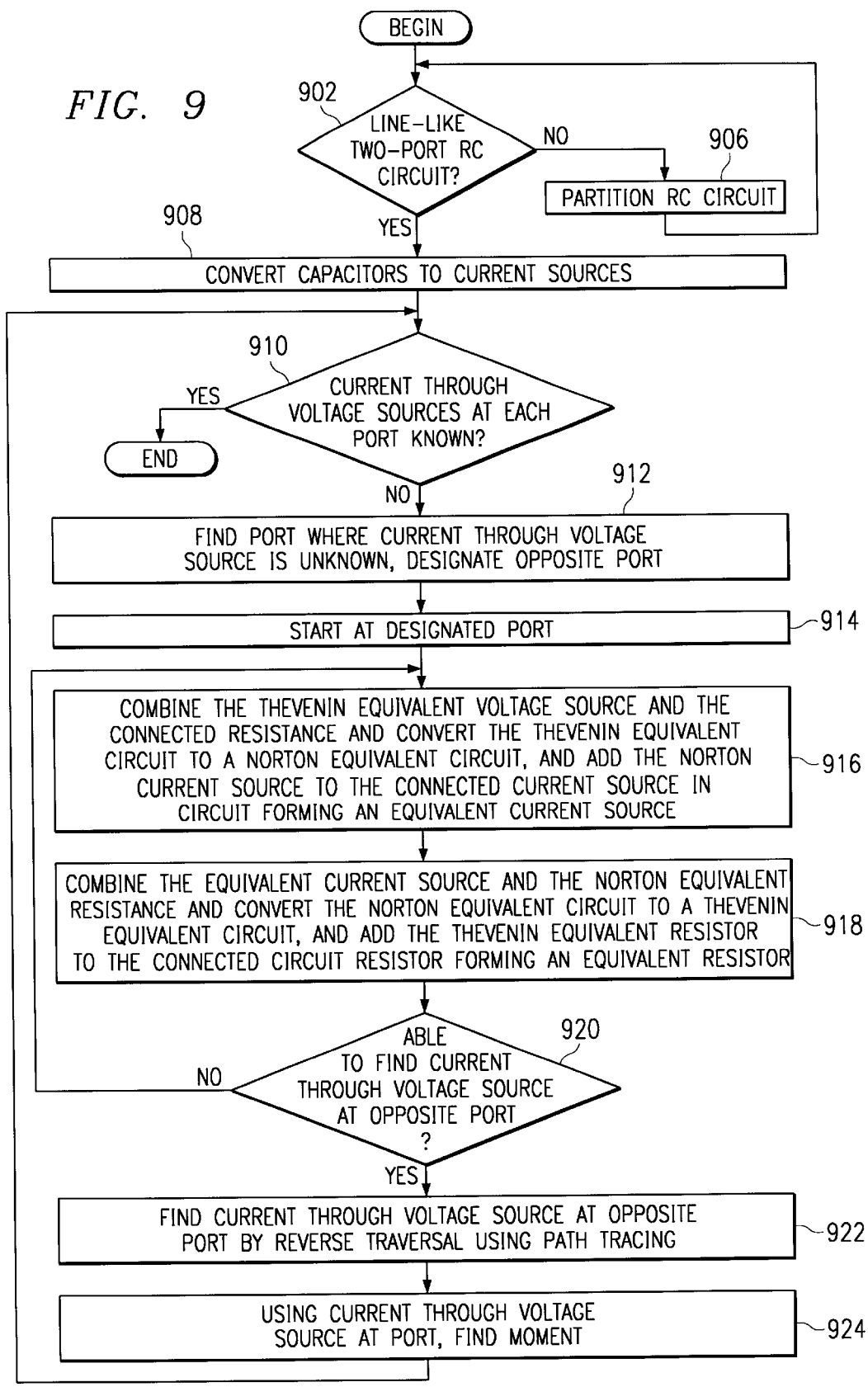
FIG. 9 is a block diagram depicting a process for finding moments of each port in a two port line-like RC circuit in accordance with a preferred embodiment of the present invention.

FIG. 9 is a flowchart depicting a process for finding moments of each port in a two port line-like RC circuit in accordance with a preferred embodiment of the present invention. Initially, it must be determined that the RC circuit is a line-like two-port RC circuit (step 902). If not, the circuit may be partitioned in accordance with a preferred embodiment of the present invention as discussed below with respect to FIG. 13 (step 906). After the circuit is in a line-like two-port RC configuration, the capacitors connected to ground are converted to equivalent current sources to ground (step 908).

Next, a determination is made as to whether the current through the voltage sources at each port are known (step 910). If the current is known, the process ends. Otherwise, the process finds a port where the current through the voltage sources is known and designates the opposite port (step 912). The recursive Thevenin to Norton conversions start at the designated port (step 914).

Using the voltage source at the designated port and the connected resistor (Thevenin equivalent circuit), the voltage source is combined with the connected resistance and the Thevenin equivalent circuit is converted to a Norton equivalent circuit. The resultant Norton current source is then added to the connected current source in the circuit to form an equivalent current source (step 916).

After a Norton equivalent circuit has been defined, combine the equivalent current source derived in the previous step with the Norton equivalent resistance, and convert the Norton equivalent circuit to a Thevenin equivalent circuit. The resultant Thevenin equivalent resistor is then added to the connected circuit resistor to form an equivalent resistor (step 918).

In accordance with a preferred embodiment of the present invention, the Thevenin-Norton-Thevenin conversions are actually a recursive process which starts and stops with a Thevenin circuit. The number of iterations needed to reduce the circuit to the final Thevenin circuit depends on the number of original elements in the circuit. After each iterative Thevenin-Norton-Thevenin conversion and a new Thevenin equivalent circuit has been defined, a check is performed to determine if it is possible to find the current through the voltage source at the opposite port (step 920). If it is not possible to calculate the current through the voltage source at the port in the current circuit configuration, the process returns to step 916 and the Thevenin equivalent circuit is again converted to a Norton equivalent circuit.

If at step 920 the current through the voltage source at the opposite port is determinable, a reverse traversal is preformed by path tracing from the opposite node to the designated node and satisfying Kirchoff Current Law (KCL) at all the nodes in the path (step 922).

Using the voltage and current at the ports, the moment is calculated at the port using Equation (17) above, setting v=1 and $\dot{x}$=0 and solving for port current i for the first moment, and setting v=0 and $\dot{x}$=$-A^{-1}B$ and solving for port current I for the second moment (step 924). The process then reverts to step 910, where a check is again made as to whether the current through the voltage sources at each port is known. The process ends.

This method is also applicable for RLGC lines; however, only the RC case is shown. The original RLC circuit can therefore by represented by an equivalent circuit consisting of resistances, voltage sources (obtained from inductors and ports) and current sources (obtained from capacitors). This equivalent circuit can be efficiently solved in linear time through repeated Thevenin-Norton conversions. In case of inductance, the equivalent voltage source is in series with the resistance. The voltage source (obtained from the inductor) is reduced through the Thevenin equivalent step 916, and the current source (obtained from the capacitor) is reduced through the Norton equivalent step 918.

Figure 10:
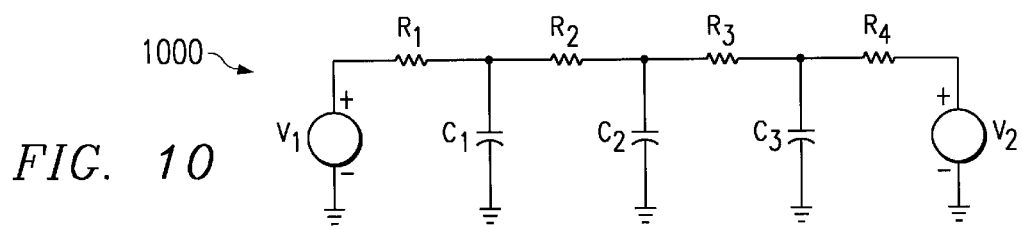
FIG. 10 illustrates a typical RC circuit as may be used in accordance with a preferred embodiment of the present invention.

FIG. 10 illustrates a typical RC circuit. RC circuit 1000 consists of resistors $R_1$, $R_2$, $R_3$ and $R_4$ in series with capacitor $C_1$, placed between the junction of resistors $R_{1\ and\ R_2}$ and ground, capacitor $C_2$, placed between the junction of resistors $R_2$ and $R_3$ and ground, and capacitor $C_3$, placed between the junction of resistors $R_3$ and $R_4$ and ground. Voltage source $V_1$ connects to resistor $R_1$, and voltage source $V_2$ connects to resistor $R_4$. For an illustration of the method, the moment of RC 1000 will be computed.

Figure 11:
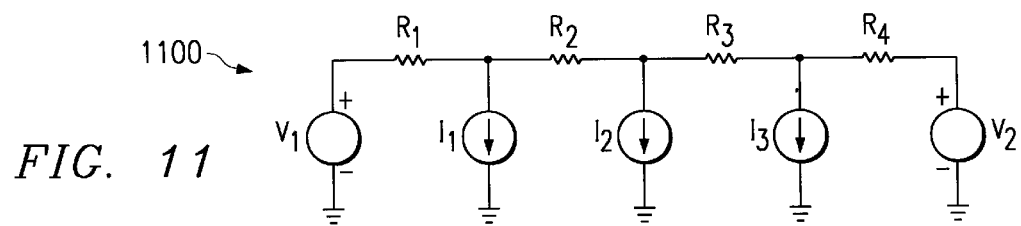
FIG. 11 shows current sources $I_1$, $I_2$ and $I_3$ replacing capacitors $C_2$, $C_2$ and $C_3$ during moment computation in accordance with a preferred embodiment of the present invention.

Referring now to FIG. 11, capacitors $C_1$, $C_2$ and $C_3$ are replaced during moment computation by current sources $I_1$, $I_2$ and $I_3$, respectively. Hence, circuit 1000 depicted in FIG. 10 is replaced by circuit 1100 shown in FIG. 11. The circuit shown in FIG. 11 can be efficiently solved by starting from one port ($V_2$ in the depicted example) and performing repeated Thevenin to Norton to Thevenin conversions, as is well understood by one of ordinary skill in the art.

Figure 12A:
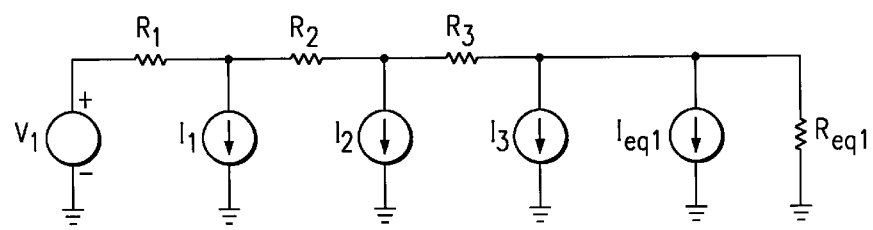
FIGS. 12A–12D depict the stages of recursive Norton to Thevenin conversions for the circuit illustrated in FIG. 11.
Figure 12B:
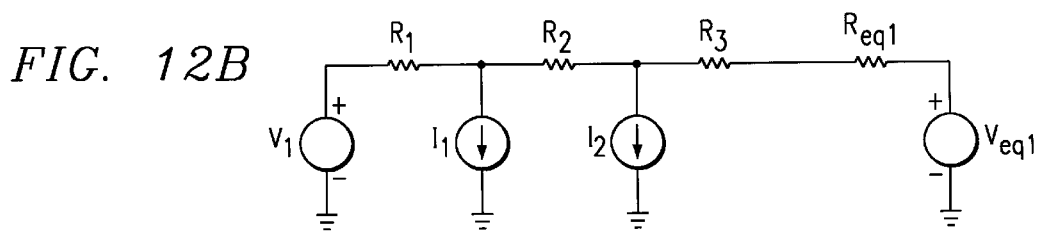
Figure 12C:
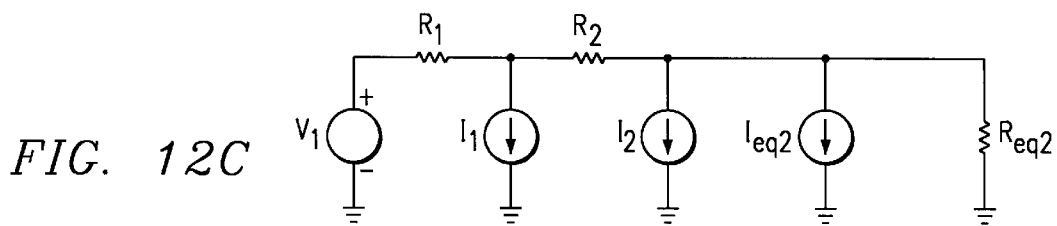
Figure 12D:
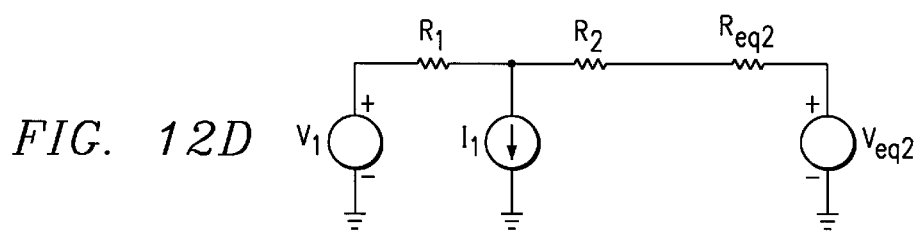

FIGS. 12A–12D illustrate the stages of recursive conversion represented in FIG. 11. FIG. 12A shows converting $R_4$ and $V_2$ to a Norton equivalent circuit. Starting from voltage source $V_2$, resistance $R_4$ and voltage source $V_2$ can be combined and converted to a Norton equivalent, yielding a grounded current source $I_{eq1}$ and a grounded resistance $R_{eq1}$. Next, forming $I_{eq2}$ by adding =$I_3$+$I_{eq1}$. FIG. 12B shows converting $R_{eq1}$ and $I_{eq2}$ to Thevenin equivalent circuit yielding $V_{eq1}$ and $R_{eq1}$. . . $R_{eq2}$ is then formed by adding $R_{eq2}$=$R_3$+$R_{eq1}$ and the grounded current source $I_{eq1}$ can be added to already existing grounded current source $I_3$, i.e., $I_{eq2}$=$I_{eq1}$+$I_3$. The in line resistance $R_3$ can then be added to the resistance of the Thevenin equivalent $R_{eq2}$=$R_3$+$R_{eq1}$. After one Norton conversion (depicted in FIG. 12A) and one Thevenin conversion (depicted in FIG. 12B), the circuit depicted in FIG. 12C is a circuit similar to the circuit depicted in FIG. 12A but with one less node. FIG. 12C shows the results of converting $R_{eq2}$ and $V_{eq1}$ to Norton. After the Thevenin to Norton conversion, $I_{eq3}$ is formed by adding $I_{eq3}$=$I_2$+$I_{eq2}$. Finally, FIG. 12D shows converting the Norton equivalent circuit consisting of $R_{eq2}$ and $I_{eq3}$ to Thevenin and finally $R_{eq3}$ (not shown) is formed adding $R_{eq3}$=$R_2$+$R_{eq2}$. This procedure is repeated until the other port voltage source (in this case $V_1$) is reached.

Note that resistors are added during the Thevenin equivalent and currents are added during the Norton equivalent. Once the other port voltage source is reached (say $V_1$), the current through voltage source $V_1$ can be computed. A reverse traversal from $V_1$ back to $V_2$ yields the current through voltage source $V_2$ and voltage values at the intermediate nodes. The reverse traversal does not require Norton to Thevenin conversions. It simply requires path tracing and satisfying Kirchoff Current Law (KCL) at all the nodes in the path.

Figure 13:
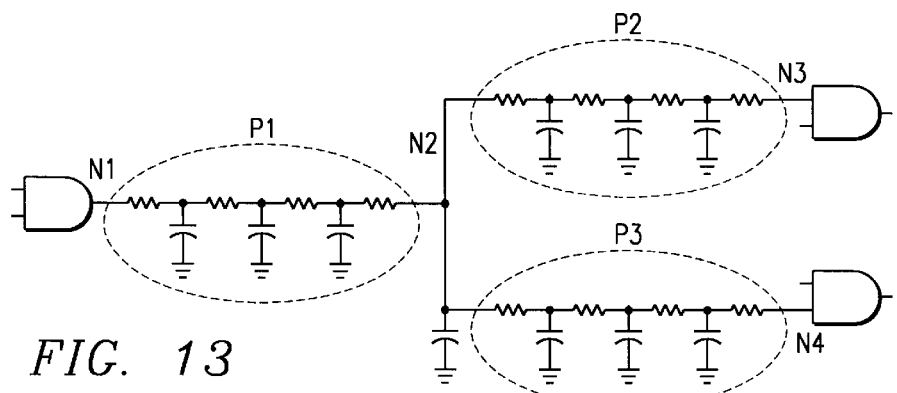
FIG. 13 shows an interconnect which is partitioned into three two-port circuits with a total of four ports.

Linear circuit partitioning is essential during model reduction. Model reduction of an N port circuit yields an N dimensional dense port behavior. FIG. 13 depicts a circuit having three nonlinear ports, nodes N1, N3 and N4. Reducing the circuit with three ports will yield a dense three-by-three stencil even though the original circuit is sparse. Some of the stencil sparsity can be recovered by adding state equations, along with the port equations, into the circuit equation matrix. However, the addition of the state equations increases the size of the matrix and does not fully recover the sparsity of the original circuit.

Maintaining the sparsity of the original circuit and minimizing the number of additional ports would be the ideal solution. Node N2 is an intersection node; reducing or eliminating node N2 creates a fill-in and makes the circuit stencil dense. The ideal pivoting sequence for the circuit shown in FIG. 13 has the following order: node N3 or node N4, . . . , followed by node N4 or node N3, . . . , followed by node N2, . . . , followed by node N1. Hence, the downstream matrix factorization package requires node N2 to be a pivoting node in an ideal sequence. The partitioning of the circuit and retention of node N2 as a port allows the matrix factorization this flexibility.

The interconnect is partitioned into three two-port circuits with the total of four ports (as shown in FIG. 13). This circuit partitioning adds one more port to the interconnect but maintains the spatial sparsity of the original circuit.

Figure 14:
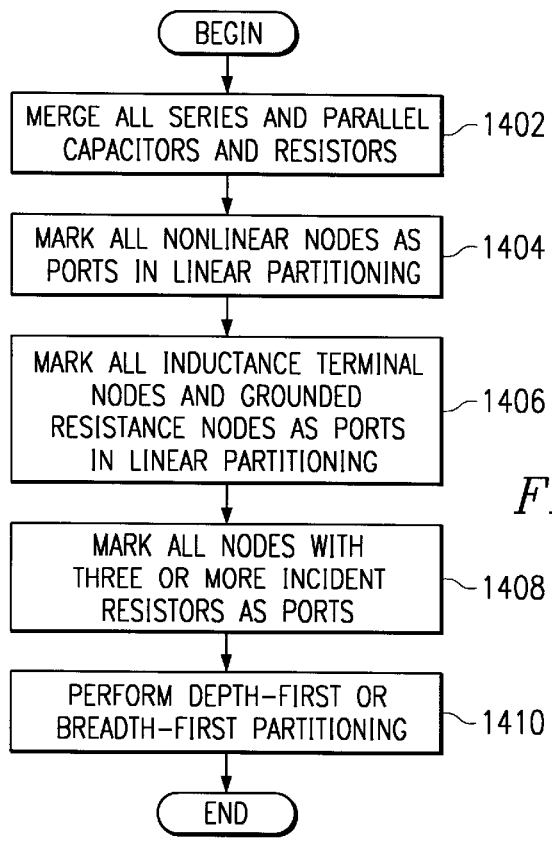
FIG. 14 is a block diagram illustrating a partitioning scheme to aid the model reduction procedure in accordance with a preferred embodiment of the present invention.

FIG. 14 is a flowchart illustrating a partitioning scheme to aid the model reduction procedure in accordance with a preferred embodiment of the present invention. Initially, the process merges all series and parallel capacitors and resistors (step 1402). Next, all nonlinear nodes (i.e., nodes in common with diodes, mosfets or bipolar transistors terminal nodes) are marked as ports in linear partitioning (step 1404). All inductance terminal nodes and grounded resistance nodes are marked as ports in linear partitioning (step 1406). The process continues by marking all nodes with three or more incident resistors as ports (step 1408). Finally, depth-first or breadth-first partitioning is performed to collect elements between two ports into a partition (step 1410).

The procedure depicted in FIG. 14 guarantees that all partitions are RC lines. An alternate partitioning scheme may partition the circuit into sets of two ports but may not constrain each partition to be an RC line. In such a case, the model reduction procedure disclosed with respect to the discussion of FIGS. 5–8 remains valid, though matrix factorization and forward and backward substitution should be used to compute the circuit moments.

It should be noted that interconnect partitioning schemes can also be used in conjunction with previous model reduction procedures. However, the resultant reduced circuit may not be realizable.

Figure 15:
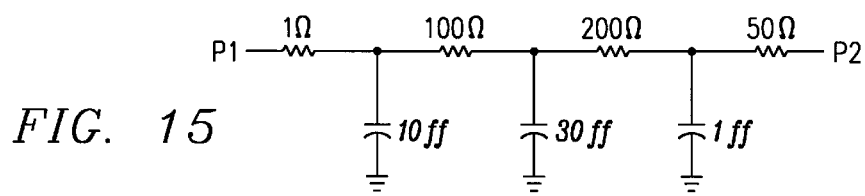
FIG. 15 is a circuit diagram depicting an RC circuit that is stiff.

Next, a few small circuit examples are used to illustrate the model reduction procedure. FIG. 15 is a circuit diagram depicting a small stiff RC circuit (i.e., the circuit has varying time constants) with the resistance varying from 1 ohm to 200 ohms and the capacitance varying from 1 ff to 30 ff.

When resistance is measured in Kilo ohms (i.e., for this circuit, 0.001, 0.1, 0.2 and 0.05) and capacitance is measured in Picofarad (i.e., for this circuit, 0.01, 0.03 and 0.001), the moments of this circuit are:

$(y_{11})_0 = 2.849$
$(y_{11})_1 = 0.00321946$
$(y_{12})_1 = 0.00629906$
$(y_{22})_1 = 0.02551824$

Equations (12) and (13) are used to compute the two boundary values for k:

$k_1 = 0.919813$
$k_2 = -0.372782$

Figure 16:
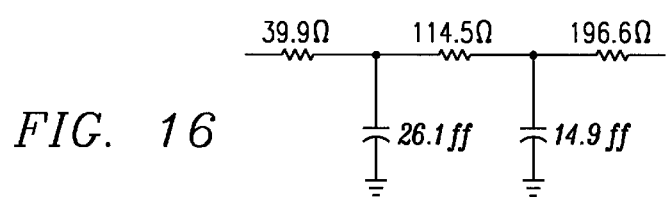
FIG. 16 is a circuit diagram illustrating the reduced RC circuit for the small example depicted in FIG. 15.

Realizability parameter $$k_r = \frac{k_1 + k_2}{2} = 0.273526,$$

and the circuit moments are substituted in Equation (10) to yield the final reduced circuit shown in FIG. 16.

FIG. 16 is a circuit diagram illustrating the reduced RC circuit for the small example depicted in FIG. 15. Note that the total resistance (351 ohms) and total capacitance (41 ff) of the original circuit are maintained in the reduced circuit. This is a desirable property of the proposed reduction procedure. The reduced circuit depicted in FIG. 16 also matches the first four independent moments of the circuit depicted in FIG. 15. The accuracy of the model reduction procedure for the small stiff circuit example, produced in accordance with a preferred embodiment of the present invention for model reduction, has been shown to produce very accurate results because both the loading and transfer moments are matched at each port.

Figure 17:
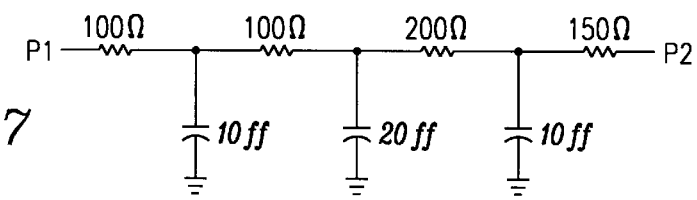
FIG. 17 is a circuit diagram depicting a non-stiff RC circuit.
Figure 18:
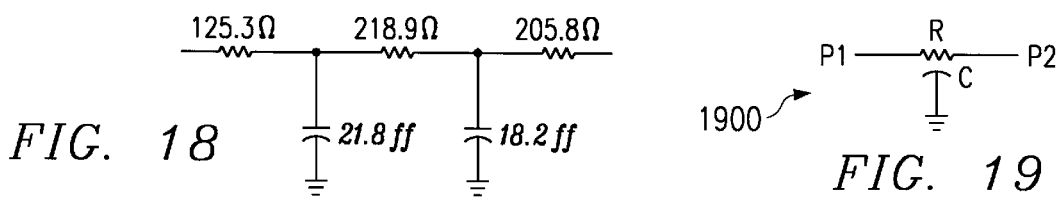
FIG. 18 illustrates the reduced RC circuit for the non-stiff small circuit example shown in FIG. 17 in accordance with a preferred embodiment of the present invention.

FIG. 17 is a circuit diagram depicting a non-stiff RC circuit. For the circuit shown in FIG. 17, the corresponding k values are $k_1 = 0.797872$ and $k_2 = -0.62$. The average k used in the reduction equations is $k_r = 0.0889362$. FIG. 18 illustrates the reduced RC circuit for the non-stiff small circuit example shown in FIG. 17 in accordance with a preferred embodiment of the present invention.

Port $P_1$ is excited with an input voltage source, and port $P_2$ is loaded with a capacitance of 10 ff. As seen from the waveforms, the proposed model reduction procedure provides very accurate results, both for stiff and non-stiff circuits.

Figure 19:
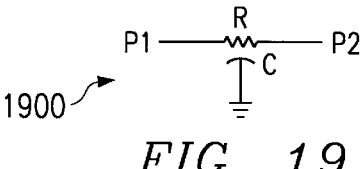
FIG. 19 is a representation circuit depicting a uniform distributed RC line.

FIG. 19 is a representation of a uniform distributed RC line 1900. RC line 1900 consists of a total resistance =R and a total capacitance =C between ports $P_1$ and $P_2$. The transfer function of uniform RC line 1900 can be written as:

$$y_{11}(s) = y_{22}(s) = \sqrt{\frac{sC}{R}} \coth(\sqrt{sRC})  \quad \text{Equation (18)}$$

$$y_{12}(s) = y_{21}(s) = -\sqrt{\frac{sC}{R}} \operatorname{csch}(\sqrt{sRC}) \quad \text{Equation (19)}$$

where $$\coth(x) = \frac{e^x + e^{-x}}{e^x - e^{-x}}$$

and $$\operatorname{csch}(x) = \frac{2}{e^x - e^{-x}}.$$

The four independent circuit moments are:

$$(y_{11})_0 = (y_{22})_0 = -(y_{12})_0 = -(y_{21})_0 = -\frac{1}{R} \quad \text{Equation (20)}$$

$$(y_{11})_1 = (y_{22})_1 = \frac{C}{3}$$

$$(y_{12})_1 = (y_{21})_1 = \frac{C}{6}$$

Note that $(y_{11})_1 = (y_{22})_1$ since the line is uniform and symmetric. Values of D, $k_1$ and $k_2$ are obtained as follows:

$$D = \frac{C^2}{12} \quad \text{Equation (21)}$$

$$k_1 = \frac{1}{2}$$

$$k_2 = \frac{-1}{2}$$

$$k_r = \frac{k_1 + k_2}{2} = 0.$$

The parameter k was introduced to skew the two capacitors in the reduced circuit. A zero value of $k_r$ is expected for a uniform RC line.

Figure 20:
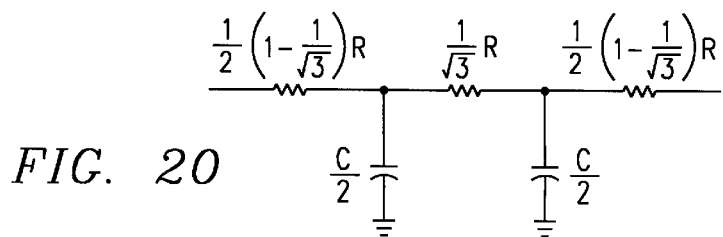
FIG. 20 illustrates the reduced RC circuit for the uniform RC line shown in FIG. 19 in accordance with a preferred embodiment of the present invention.

FIG. 20 illustrates the reduced RC circuit for uniform RC line 1900 in the example shown in FIG. 19 in accordance with a preferred embodiment of the present invention. Note that the reduced circuit is also symmetric, and total resistance R and total capacitance C are maintained in the reduced circuit. For circuits modeled with uniform RC lines, the circuit shown in FIG. 20 can be used as a reduced lumped circuit.

Table 1 shows the amount of reduction and accuracy of the proposed model reduction procedure. Various industrial examples are shown, with the circuit size ranging from 6 nodes to 10211 nodes. The percentage of reduction is measured in terms of reduction in number of nodes. The circuits shown in the table are multi-port circuits, with the larger circuit having an especially large number of ports. Circuits denoted by ckt5, ckt8, ckt9 and ckt11 also have loops (or meshes). The accuracy is shown as a percentage error in the circuit waveforms between the circuit with no reduction and the circuit with reduction. Delay is measured as 50% crossing time from a primary input to a primary output. The output slew is measured as the difference between the 10% and 90% times on a primary output. The accuracy shown in Table 1 are worst-case errors for the set of all primary inputs and primary outputs for a given circuit.

Table 1 illustrates the reduction percentage and timing accuracy for a circuit reduction method in accordance with a preferred embodiment of the present invention. As seen from Table 1, the proposed method provides very high reduction percentages (from 33.3% to 99.85%) with very high accuracy (with the worst case delay error being −0.8% and the worst case slew error being 3.65%). As expected, the disclosed model reduction procedure works better for larger circuits.

TABLE 1

| Circuit | Number of Nodes | % Reduction | Accuracy (Percentage Error) Delay (%) | Output Slew (%) |
|---|---|---|---|---|
| ckt1 | 6 | 33.3% | −0.45% | 1.62% |
| ckt2 | 10 | 60.0% | −0.8% | 3.65% |
| ckt3 | 32 | 76.92% | −0.17% | 0.71% |
| ckt4 | 65 | 81.13% | −0.03% | 0.23% |
| ckt5 | 152 | 95.52% | −0.19% | 0.94% |
| ckt6 | 250 | 94.52% | −0.14% | 0.70% |
| ckt7 | 502 | 96.38% | −0.60% | 0.21% |
| ckt8 | 774 | 98.25% | −0.28% | 0.50% |
| ckt9 | 1681 | 99.50% | −0.54% | 1.87% |
| ckt10 | 5924 | 99.74% | −0.23% | 0.73% |
| ckt11 | 10211 | 99.85% | 0.09% | 1.17% |

Table 2 shows the efficiency of the model reduction procedure as measured in CPU run time. Simulation times for the reduced circuit are shown for both moment computation methods, first by matrix factorization and second by the Norton-Thevenin conversion method. The table compares the simulation run time of the circuit with no reduction with the run time of the circuit with reduction. Simulations of both the original circuit and the reduced circuit are performed by Backward Euler numerical integration with tight local truncation error control. The simulation time for the reduced circuit also includes the moment computation time and the reduction time. The reduction time is trivial, as it only involves evaluation of a few equations.

As seen from Table 2, significant speedup is obtained from the disclosed model reduction procedure. The simulation time for the reduced circuit is shown for two different cases. In the first case, the moments of the original circuit are computed through matrix (LU) factorization and forward and backward substitution (FBS). In the second case, the moments of the original circuit are computed through the Norton-Thevenin conversion method described above.

For instance, for ckt11 with 10211 nodes, the original simulation without reduction takes 23.09 seconds; the simulation with the proposed reduction procedure takes 0.54 seconds if the moments are computed by matrix method and 0.11 seconds if the moments are computed using the Norton-Thevenin method.

TABLE 2

| Curcuit | Number of Nodes | Simulation Time (No Reduction) (in seconds) | Simulation Time (with Reduction) (in seconds) Matrix Method | Norton-Thevenin Method |
|---|---|---|---|---|
| ckt1 | 6 | 0.01 | 0.01 | 0.01 |
| ckt2 | 10 | 0.01 | 0.01 | 0.01 |
| ckt3 | 32 | 0.03 | 0.01 | 0.01 |
| ckt4 | 65 | 0.07 | 0.02 | 0.02 |
| ckt5 | 152 | 0.16 | 0.03 | 0.03 |
| ckt6 | 250 | 0.38 | 0.04 | 0.04 |
| ckt7 | 502 | 0.75 | 0.04 | 0.04 |
| ckt8 | 774 | 1.59 | 0.06 | 0.05 |
| ckt9 | 1681 | 4.48 | 0.10 | 0.05 |
| ckt10 | 5924 | 11.16 | 0.22 | 0.07 |
| ckt11 | 10211 | 23.09 | 0.54 | 0.11 |

Next, the speedup of the Norton-Thevenin method is compared over the matrix method for moment computation. The advantage of the Norton-Thevenin method is that it is linear with the number of elements in a given two-port circuit. This advantage is noticeable for larger circuits, since they have a greater probability of having two-port partitions with large number of nodes in a single partition. Table 3 illustrates moment computation time comparison between matrix factorization and the Norton-Thevenin conversion method. Table 3 compares the moment computation time for the three larger circuits. As seen from Table 3, there is significant advantage in using the Norton-Thevenin method for moment computation. The linear complexity of the Norton-Thevenin method can also be seen from Table 3.

TABLE 3

| Circuit | Number of Nodes | Moment Computation Time (in seconds) Matrix (LU) Factorization | Norton-Thevenin Method |
|---|---|---|---|
| ckt9 | 1681 | 0.07 | 0.02 |
| ckt10 | 5924 | 0.19 | 0.04 |
| ckt11 | 10211 | 0.51 | 0.08 |

One of ordinary skill in the art will understand that the preferred embodiments of the present invention may be employed in a wide variety of circuit designs and verification applications of circuits. Since the reduction procedure is realizable, it naturally fits with other analysis programs, such as nonlinear circuit simulation, static timing analysis, and static circuit checking. The model reduction procedure is a preprocessor for any of the downstream circuit analysis programs and requires no changes to the programs themselves. If the circuits contain large interconnects (typically found in global nets and long local interconnects), the model reduction procedure works exceedingly well, yielding more than 90% reduction.

Realizable interconnect reduction techniques for on-chip RC interconnects are disclosed herein. The original circuit is first partitioned into sets of two-port circuits to maintain the spatial sparsity of the reduced model. Each two-port circuit is matched to a reduced RC circuit instead of reduced state equations, as in previous techniques. Efficient closed form expressions are derived for computation of the element values of the reduced RC circuit. Efficient linear time moment computation techniques are also presented for two-port circuits. Efficiency and accuracy of the reduction technique has been shown for various industrial circuits. The proposed method yields a significant amount of interconnect reduction (up to 99%) while maintaining the waveform accuracy of the original circuit (the worst-case delay error being −0.8% and the worst case slew error being 3.65%).

Furthermore, the amount of reduction is lower if the circuit contains a large number of transistors and the interconnect is local, whereby the circuit does not contain the number of RCs necessary for effectively utilizing the present invention. Consider a QBUS circuit with 118 mosfets and about 800 RCs. Most of the interconnect is within the channel connected components in the logic and has only a few RCs modeled for each wire. The disclosed model reduction procedure produces 41.93% reduction in the interconnect. Given the structure of the circuit, this is a reasonable amount of reduction. The simulation of the circuit is dominated by simulation of the nonlinear devices. The simulation time is 5.86 seconds without reduction and 5.08 seconds with reduction.

It is important to note that, while the present invention has been described in the context of a fully functioning data processing system, those of ordinary skill in the art will appreciate that the processes of the present invention are capable of being distributed in a form of a computer readable medium of instructions and a variety of forms, and that the present invention applies equally regardless of the particular type of signal bearing media actually used to carry out the distribution. Examples of computer readable media include recordable-type media such as floppy discs, hard disk drives, RAM, and CD-ROMs and transmission-type media, such as digital and analog communications links.

The foregoing description of the present invention has been presented for purposes of illustration and description but is not limited to be exhaustive, nor limited to the invention in the form disclosed. Many modifications and variations will be apparent to those of ordinary skill in the art. This embodiment was chosen and described in order to best explain the principles of the invention and the practical application, and to enable others of ordinary skill in the art to understand the invention for various embodiments with various modifications as are suited to the particular use contemplated.

What is claimed is:

1. A data processing system implemented method for realizing an interconnect reduction circuit for RC interconnects, the method comprising:

matching an original two-port circuit to a reduced circuit model having a specific layout configuration;

calculating moments of the original two-port circuit; and using the moments calculated for the original circuit, determining values of circuit elements in the reduced circuit model.

2. The method recited in claim 1, wherein the original two-port circuit is defined by partitioning a circuit into sets of two-port circuits, one of the two-port circuits being the original two-port circuit.

3. The method recited in claim 1, wherein the reduced circuit model comprises a two-port line-like RC circuit having at least one resistor and one sink.

4. The method recited in claim 1, wherein the reduced circuit model having a specific layout configuration comprises a two-port line-like RC circuit including three resistors and two capacitors.

5. The method recited in claim 4, wherein values of the two capacitors are dependent upon a parameter.

6. The method recited in claim 4, wherein exactly four variables are needed for determining values of the two capacitors and the three resistors.

7. The method recited in claim 2, wherein the step of partitioning comprises:

merging all capacitors and resistors connected in series or connected in parallel;

marking all nonlinear nodes as ports;

marking all inductance terminal nodes and grounded resistance nodes as ports;

marking all nodes with three or more incident resistors as ports; and collecting all circuit elements between two ports in a depth-first or breadth-first partitioning.

8. The method recited in claim 1, wherein the reduced circuit model comprises a two-port model having a first port and a second port, with the first resistor connected between the first port and a second resistor, and further comprising a third resistor connected to both the second port and an opposite end of the second resistor and still further comprising a first and a second capacitor, wherein a first end of the first capacitor is interposed between the junction of the first and second resistors and a second end of the first capacitor is connected to a ground and wherein a first end of the second capacitor is interposed between the junction of the second and third resistors and a second end of the second capacitor is connected to a ground.

9. The method recited in claim 2, wherein the original two-port circuit is the first two-port circuit and the reduced circuit model is the first reduced circuit model, the step of partitioning further comprises:

defining a two-port circuits from the sets of two-port circuits;

matching the second two-port circuit to a second reduced circuit model having a specific layout configuration; and calculating moments of the second two-port circuit; and using the moments calculated for the second circuit, determining values of circuit elements in the second reduced circuit model.

10. A data processing system implemented method for performing a circuit simulation by realizing an interconnect reduction circuit for simulating RC interconnect circuits, the method comprising:

partitioning a circuit into sets of two-port circuits, one of the two-port circuits being an original two-port circuit matching the original two-port circuit to a reduced circuit model having a specific layout configuration;

calculating moments of the original two-port circuits; and using the moments calculated for each original circuit, determining values of circuit elements in the reduced circuit model; and utilizing the reduced circuit in the circuit simulation.

11. A data processing system for realizing an interconnect reduction circuit for RC interconnects, the method comprising:

matching means for matching an original two-port circuit to a reduced circuit model having a specific layout configuration;

calculating means for calculating moments of the original two-port circuit; and determining means for determining values of circuit elements in the reduced circuit model, using the moments calculated for the original circuit.

12. The system recited in claim 11 further comprises:

partitioning means for partitioning a circuit into sets of two-port circuits, one of the two-port circuits being the original two-port circuit.

13. The system recited in claim 11, wherein the reduced circuit model comprises a two-port line-like RC circuit having at least one resistor and one sink.

14. The method recited in claim 11, wherein the reduced circuit model having a specific layout configuration comprises a two-port line-like RC circuit including three resistors and two capacitors.

15. The system recited in claim 14, wherein values of the two capacitors are dependent upon a parameter.

16. The system recited in claim 14, wherein exactly four variables are needed for determining values of the two capacitors and the three resistors.

17. The system recited in claim 12, wherein the partitioning means for partitioning comprises:

merging means for merging all capacitors and resistors connected in series or connected in parallel;

marking means for marking all nonlinear nodes as ports;

marking means for marking all inductance terminal nodes and grounded resistance nodes as ports;

marking means for marking all nodes with three or more incident resistors as ports; and collecting means for collecting all circuit elements between two ports in a depth-first or breadth-first partitioning.

18. The system recited in claim 11, wherein the reduced circuit model comprises a two-port model having a first port and a second port, with the first resistor connected between the first port and a second resistor, and further comprising a third resistor connected to both the second port and an opposite end of the second resistor and still further comprising a first and a second capacitor, wherein a first end of the first capacitor is interposed between the junction of the first and second resistors and a second end of the first capacitor is connected to a ground and wherein a first end of the second capacitor is interposed between the junction of the second and third resistors and a second end of the second capacitor is connected to a ground.

19. The system recited in claim 12, wherein the original two-port circuit is the first two-port circuit and the reduced circuit model is the first reduced circuit model, the step of partitioning further comprises:

defining means for defining a two-port circuits from the sets of two-port circuits;

matching means for matching the second two-port circuit to a second reduced circuit model having a specific layout configuration; and calculating means for calculating moments of the second two-port circuit; and determining means for determining values of circuit elements in the second reduced circuit model using the moments calculated for the second circuit.

20. A data processing system for performing a circuit simulation by realizing an interconnect reduction circuit for simulating RC interconnect circuits, the method comprising:

partitioning means for partitioning a circuit into sets of two-port circuits, one of the two-port circuits being an original two-port circuit matching means for matching the original two-port circuit to a reduced circuit model having a specific layout configuration;

calculating means for calculating moments of the original two-port circuits; and using means for using the moments calculated for each original circuit,r determining values of circuit elements in the reduced circuit model; and utilizing means for utilizing the reduced circuit in the circuit simulation.

21. A computer program product for realizing an interconnect reduction circuit for RC interconnects, the computer program product embodied on a computer readable medium and comprised of instructions, the instructions comprising:

matching instructions for matching an original two-port circuit to a reduced circuit model having a specific layout configuration;

calculating instructions for calculating moments of the original two-port circuit; and determining instructions for determining values of circuit elements in the reduced circuit model, using the moments calculated for the original circuit.

22. A computer program product for performing a circuit simulation by realizing an interconnect reduction circuit for simulating RC interconnect circuits, the computer program product embodied on a computer readable medium and comprised of instructions, the instructions comprising:

partitioning instructions for partitioning a circuit into sets of two-port circuits, one of the two-port circuits being an original two-port circuit matching instructions for matching the original two-port circuit to a reduced circuit model having a specific layout configuration;

calculating instructions for calculating moments of the original two-port circuits; and determining instructions for determining values of circuit elements in the reduced circuit model using the moments calculated for each original circuit; and utilizing instructions for utilizing the reduced circuit in the circuit simulation.

* * * * *